United States Patent [19]

Mihara

[11] Patent Number: 4,697,201

[45] Date of Patent: Sep. 29, 1987

[54] POWER MOS FET WITH DECREASED RESISTANCE IN THE CONDUCTING STATE

[75] Inventor: Teruyoshi Mihara, Yokosuka, Japan

[73] Assignee: Nissan Motor Company, Limited, Kanagawa, Japan

[21] Appl. No.: 729,094

[22] Filed: May 2, 1985

Related U.S. Application Data

[63] Continuation of Ser. No. 437,357, Oct. 28, 1982, abandoned.

[30] Foreign Application Priority Data

Dec. 18, 1981 [JP] Japan .................................. 56-204718

[51] Int. Cl.⁴ ..................... H01L 29/78; H01L 27/02; H01L 29/06
[52] U.S. Cl. .................................... 357/41; 357/23.4; 357/55
[58] Field of Search ............... 357/23.4, 23.8, 41, 357/55

[56] References Cited

U.S. PATENT DOCUMENTS

| | | | |
|---|---|---|---|
| 3,798,514 | 3/1974 | Hayashi et al. | 357/23.4 |
| 4,115,793 | 9/1978 | Nishizawa | 357/23.4 |
| 4,214,312 | 7/1980 | Amir | 357/41 |
| 4,225,945 | 9/1980 | Kuo | 357/55 |
| 4,228,447 | 10/1980 | Sato et al. | 357/55 |
| 4,233,617 | 11/1980 | Klaassen et al. | 357/23.4 |
| 4,243,997 | 1/1981 | Hatori et al. | 357/23 VD |
| 4,295,924 | 10/1981 | Gamache et al. | 357/55 |
| 4,316,203 | 2/1982 | Tohgai | 357/55 |
| 4,379,305 | 4/1983 | Mitchell | 357/23.4 |
| 4,393,391 | 7/1983 | Blanchard | 387/23 VD |

FOREIGN PATENT DOCUMENTS

| | | | |
|---|---|---|---|
| 2458907 | 1/1981 | France . | |
| 54-58378 | 5/1979 | Japan | 357/23 VD |
| 55-91874 | 7/1980 | Japan | 357/23.4 |
| 56-140663 | 11/1981 | Japan | 357/23 VD |

OTHER PUBLICATIONS

S. C. Sun et al., "Modeling of the On-Resistance of LDMOS, VDMOS and VMOS Power Transistors", *IEEE Transactions on Electron Devices*, vol. ED-27 (1980) pp. 356-367.

T. S. Chang et al., "Vertical FET Random-Access Memories with Deep Trench Isolation"*IBM Techanical Disclosure Bulletin*, vol. 22 (1980) pp. 3683-3687.

*Primary Examiner*—J. Carroll
*Attorney, Agent, or Firm*—Schwartz, Jeffery, Schwaab, Mack, Blumenthal & Evans

[57] ABSTRACT

In a power MOS FET, a channel forming region is established to be in contact, through a semiconductor oxide layer, with that portion of a gate region which is located on a groove extending through a source region into a drain region and with that portion of the gate region layer which is located on a planar portion where no such groove is formed. With such construction, the "on" resistance of the FET can be decreased without increasing the size thereof.

16 Claims, 20 Drawing Figures

POWER MOS FET WITH DECREASED RESISTANCE IN THE CONDUCTING STATE

This application is a continuation of application Ser. No. 437,357, filed Oct. 28, 1982, abandoned.

BACKGROUND OF THE INVENTION

1. Field of the Invention

This invention relates to a power MOS FET having a decreased "on" resistance.

2. Description of the Prior Art

There has heretofore been proposed such a power MOS FET as shown in FIGS. 1A, 1B, for example, wherein an N+ type low-resistance drain region 8 and N− type high-resistance drain region (epitaxial layer) 7 are formed in a silicon wafer whose main face comprises the (100) face; and a P type well region 6 and an N+ type source region 5 are provided, in the named order and in the form of layers, on the epitaxial layer 7. In the layer regions 5, 6 and 7 is formed, by means of anisotropic etching of the (100) face, a V-shaped groove 10 which is oriented in the face (111). Furthermore, a vapor-deposited aluminum layer 1 is provided which is connected to the source region 5 through a silicon oxide layer 4, gate electrode layer 3, PSG layer 2 consisting of phosphor glass, and contact hole 9.

With the foregoing conventional construction, when a voltage is applied to a gate electrode G, a channel is formed, as indicated at 20, in the vicinity of that portion of the P type well region 6 which is in contact with the V-shaped groove 10, so that a drain current is permitted to flow from a drain electrode D toward a source electrode S.

However, the aforementioned conventional power MOS FET is disadvantageous in that the "on" resistance thereof is increased due to the fact that the current flowing through the drain regions 7 and 8 is caused to concentrate immediately below the V-shaped groove 10. To decrease the "on" resistance, it is required that the overall size of the element be increased.

SUMMARY OF THE INVENTION

Accordingly, it is an object of the present invention to provide a power MOS FET which is so designed that the "on" resistance thereof is decreased without increasing the size thereof.

To achieve the foregoing object, according to the present invention, a channel forming region is established to be in contact, through a semiconductor oxide layer, with that portion of a gate electrode layer which is located on a groove extending through the source region into the drain region and that portion of the gate electrode layer which is located on a planar portion.

Other objects, features and advantages of the present invention will become apparent from the ensuing description taken in conjunction with the accompanying drawings.

DESCRIPTION OF THE PREFERRED EMBODIMENTS

Figure 1A:
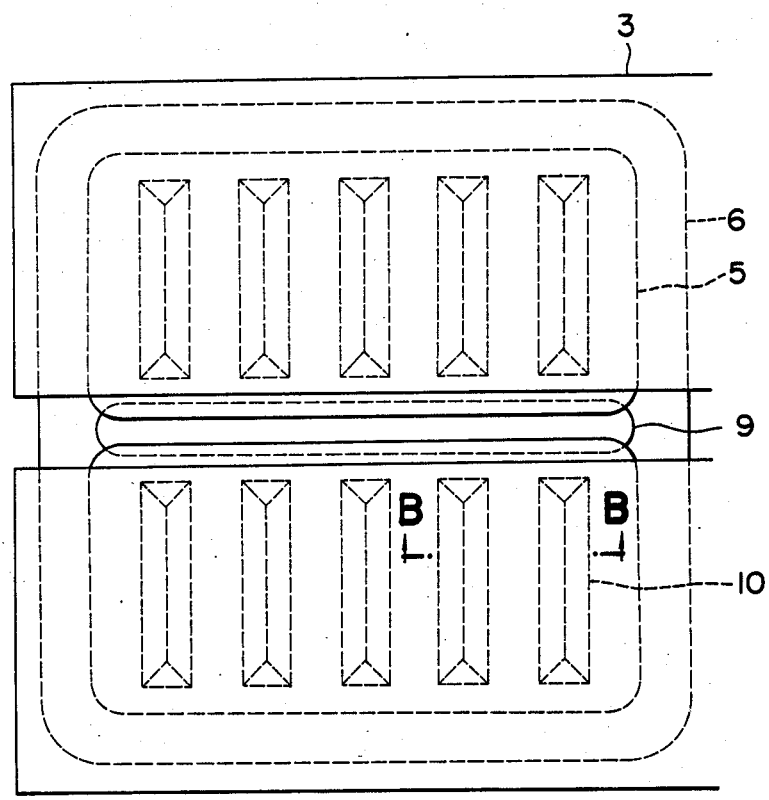
FIG. 1A is a schematic plan view illustrating a conventional power MOS FET.
Figure 1B:
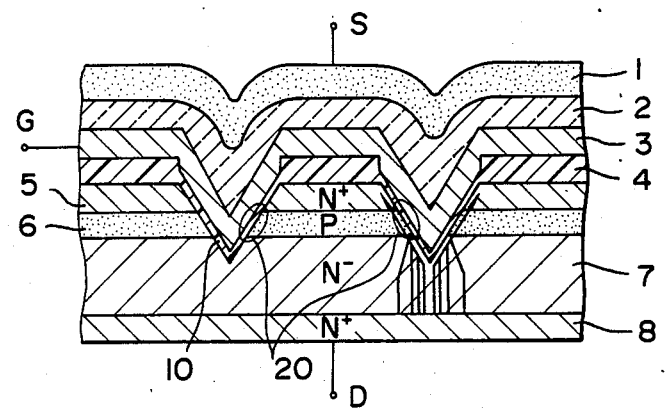
FIG. 1B is a sectional view taken along the line B—B of FIG. 1A.
Figure 2A:
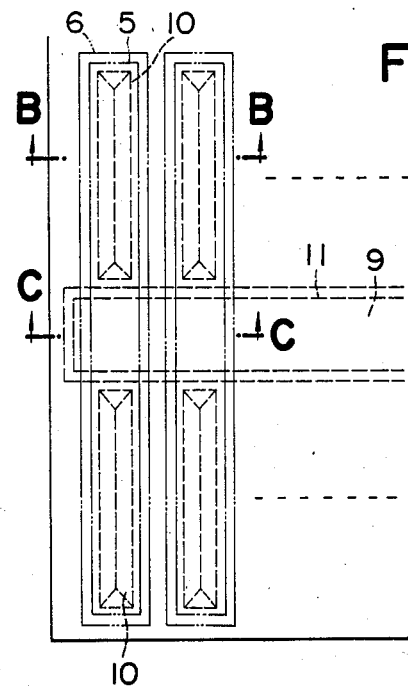
FIG. 2A is a schematic plan view showing the power MOS FET according to an embodiment of the present invention.
Figure 2B:
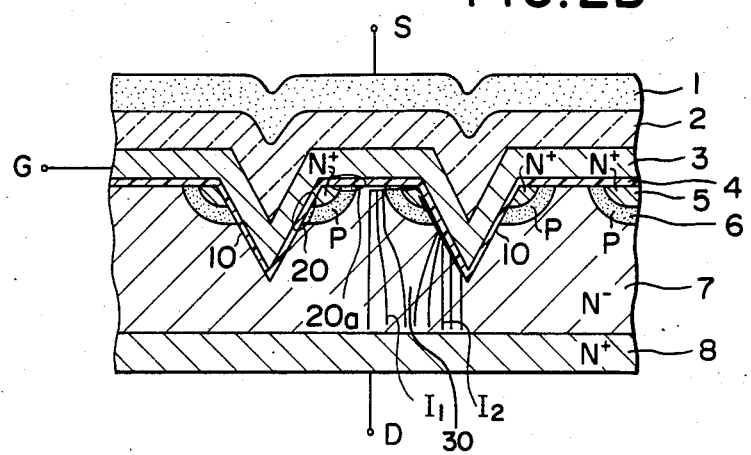
FIG. 2B is a sectional view taken along the line B—B of FIG. 2A.
Figure 2C:
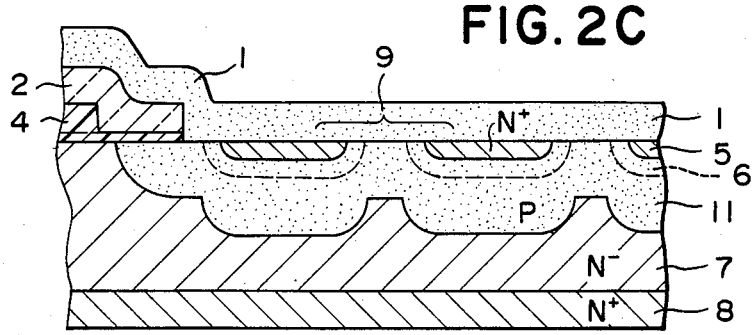
FIG. 2C is a sectional view taken along the line C—C of FIG. 2A.

Referring to FIGS. 2A, 2B and 2C, there is illustrated an embodiment of the present invention, wherein parts corresponding to those of FIGS. 1A and 1B are indicated by like reference numerals, and a further explanation thereof will be omitted. According to this embodiment, a P type well region 6 is formed in a rectangular shape by means of diffusion, and an N+ type source region 5 is also formed in a rectangular shape, on the well region 6, by means of diffusion in such a manner that the circumferential portion of the well region 6 remains exposed at a planar portion. A V-shaped groove 10 is formed which extends through the source region 5 into an N− type high-resistance drain region 7. The P type well region 6, which serves as a channel forming region, is contacted, through a silicon oxide layer 4, with a gate electrode layer 3 provided on the planar portion and V-shaped groove 10. A P+ type diffusion layer 11 is formed in the portion of the contact hole 9 by means of selective diffusion.

With the foregoing construction, drain currents $I_1$ and $I_2$ are caused to flow through drain regions 7 and 8, while being distributed therein, by virtue of the fact that channels are formed, in response to a voltage applied to the gate electrode G, in areas 20 and 20a where the P type well region 6 is contacted with the gate electrode layer through the silicon oxide layer 4, i.e., in those portions where the well region is exposed at the V-shaped and planar portion.

Thus, the area 30 where current does not flow between the drain currents I, and $I_2$, termed dead space, is minimized.

Figure 3:
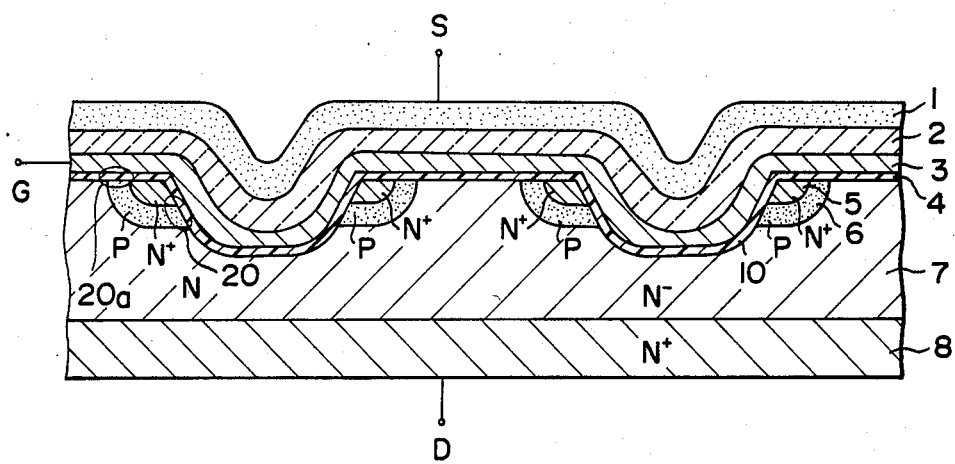
FIG. 3 is a sectional view showing the power MOS FET according to another embodiment of the present invention.

Referring to FIG. 3, there is shown another embodiment of the present invention, wherein parts similar to those of FIG. 2 are indicated by like reference numerals, and a further explanation thereof will be omitted. In this embodiment, a substantially circular, concave groove 10, instead of the V-shaped groove 10, is formed by using an isotropic etching solution such as, for example, $HNO_3$—HF—$CH_3COOH$ system, instead of highly anisotropic one.

Figure 4:
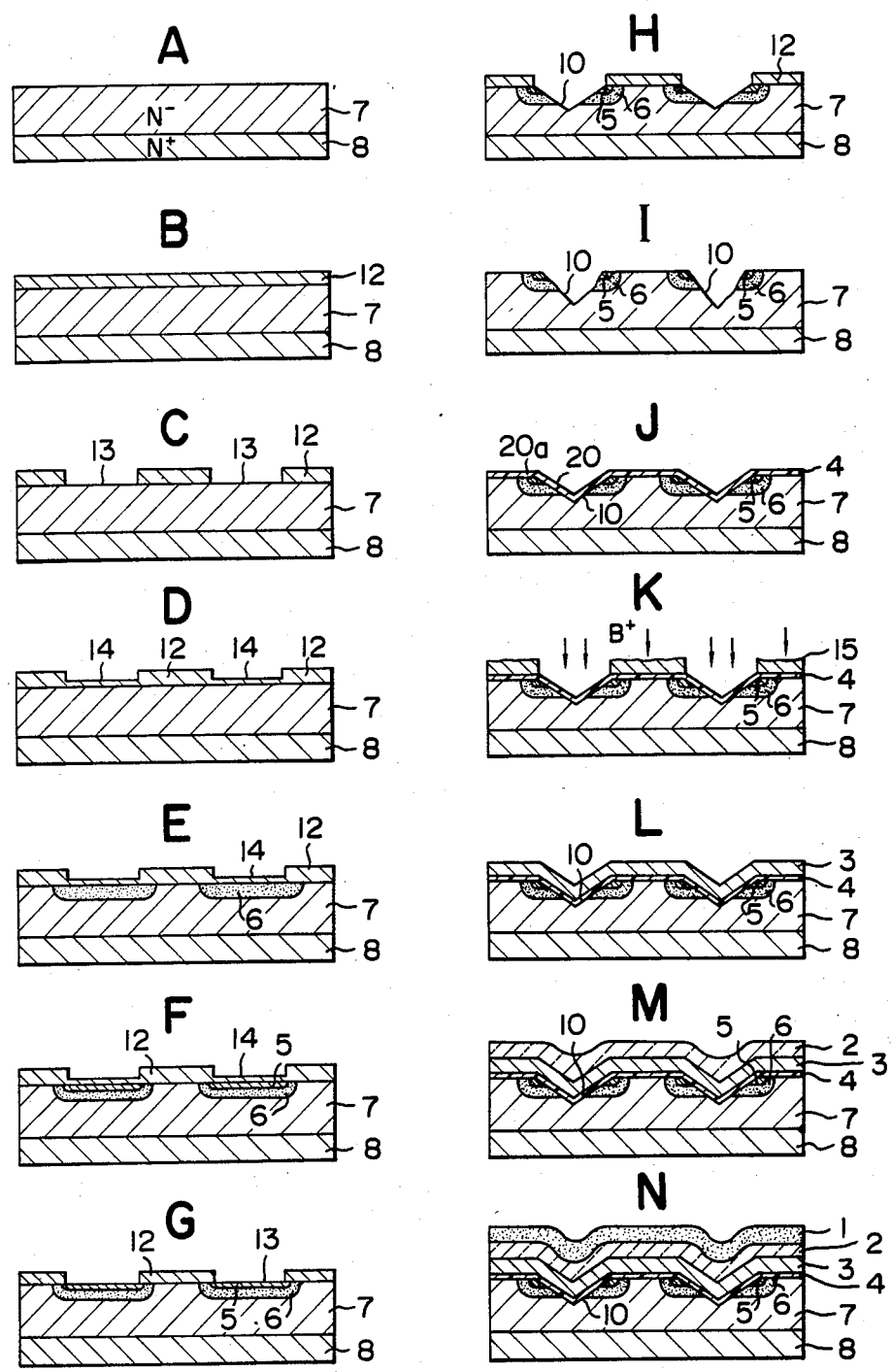
FIGS. 4A through 4N are views useful for explaining the various steps in the manufacture of the power MOS FET according to the present invention.

FIGS. 4A through 4N illustrate the various steps in the manufacture of the power MOS FET according to the present invention.

As shown in FIG. 4A, an N− type high-resistance region 7 is formed, through epitaxial growth, on an N+ type low-resistance substrate 8 whose main crystal face comprises the (100) face. Further, as shown in FIG. 4B, a silicon oxide layer 12 is formed on the low-resistance region 7 by forming a P+ type diffusion layer 11, not shown, (see FIGS. 2A and 2C), in the region 7. Subsequently, a window 13 is formed through the silicon oxide layer 12 by means of etching, as shown in FIG. 4C, the window being useful for forming a P type well region 6. A silicon oxide layer 14, which is as thin as about 1000 Å, is provided in the window 13, as illustrated in FIG. 4D, for the purpose of preventing the silicon element from being damaged during the subsequent ion injection step. At the step shown in FIG. 4E, B+ ions are injected through the silicon oxide layer 14, while at the same time, the P type well diffusion layer 6 is formed by effecting diffusion in an atmosphere of $N_2$. Then, an N+ type source region 5 is formed through injection and diffusion of P+ ions, as shown in FIG. 4F. At the step of FIG. 4G, the P+ type diffusion layer 11 (not shown) is completely covered with a photoresist or masked with V stopper, and then the silicon oxide layer 14 is eliminated by means of photoetching. At the step of FIG. 4H, etching is effected by using an anisotropic etching solution of the ethylene diamine - pyrocatechol - water system, so that a V-shaped groove 10 is formed which is so deep as to extend into the N− type drain region 7. By virtue of the fact that the formation of the aforementioned regions 5 and 6 and the V-shaped groove 10 is effected through the windows by means of triple self-align technique, it is possible to form a fine pattern with high accuracy.

As shown in FIG. 4I, the silicon oxide layer 12 is removed, leaving that portion which corresponds to the V stopper covering PAD forming region (not shown) and P+ diffusion layer 11 (see FIGS. 2A and 2C).

Thereafter, as shown in FIG. 4J, a silicon oxide layer 4 is formed through thermal oxidation. If the silicon oxide layer 4 over the planar portion is made to be as thick as 1000 Å, then the silicon oxide layer 4 over the V-shaped groove 10 will become as thick as 1200 Å, due to the difference in growth rate therebetween.

Resist layer 15 is provided on the planar portion, as shown in FIG. 4K, and subsequently, injection of B+ ions is effected. By increasing the ion concentration in the portion 20 in which the P type well region 6 is in contact with the V-shaped groove, the threshold voltage in the portion 20 is so increased as to be equal to the threshold voltage in the portion 20a in which the P type well region 6 is in contact with the planar portion. This step may be omitted in the case of a switching FET.

Thereafter, the resist material 15 is removed, and polycrystalline silicon is deposited by means of CVD or the like to form a gate region layer 3, as shown in FIG. 4L. At the step of FIG. 4M, a PSG (phosphor-glass) layer 2 is formed by means of CVD or the like.

Finally, an aluminum layer 1 is provided, by means of vapor deposition, on the entire surface of the PSG layer 2, as shown in FIG. 4N. The aluminum layer 1 is selectively etched to form gate and source electrodes.

As will be appreciated from the foregoing discussion, in the power MOS FET according to the present invention, a channel forming region is established to be in contact, through a semiconductor oxide layer, with that portion of a gate region layer which is located on a groove extending through the source region into the drain region and with that portion of the gate region layer which is located on a planar portion where no such groove is formed, whereby the "on" resistance of the FET can be decreased without increasing the size thereof.

While the present invention has been described and illustrated with respect to specific embodiments thereof, it is to be understood that the invention is by no means limited thereto but covers all changes and modifications which will become possible within the spirit and scope of the present invention.

What is claimed is:

1. A power MOS FET, comprising:
   a drain region exposed at a planar main surface of a semiconductor substrate;
   a well region adapted to serve as a channel forming region formed in said drain region in such a manner as to be exposed at said main surface;
   a source region formed in said well region in such a manner as to be exposed at said main surface;
   a groove formed in such a manner as to extend from said main surface through said source region and said well region into said drain region;
   a gate insulating layer provided over said groove and said main surface; and
   a gate electrode layer provided in contact, through said gate insulating layer, with said groove and said main surface;
   said channel forming region being defined by the circumferential portion of said well region which is exposed at said main surface, together with said drain region and said source region, and by that portion of said well region which is exposed at said groove, together with said drain region and said source region, said channel forming region being also covered with said gate electrode layer through said gate insulating layer.

2. A power MOS FET according to claim 1, wherein said groove is of a V-shaped configuration.

3. A power MOS FET according to claim 1, wherein said groove is of a substantially circular, concave configuration.

4. A power MOS FET according to claim 1, wherein said gate insulating layer comprises a silicon oxide layer.

5. A power MOS FET according to claim 2, wherein said gate insulating layer comprises a silicon oxide layer.

6. A power MOS FET according to claim 3, wherein said gate insulating layer comprises a silicon oxide layer.

7. A power MOS FET as claimed in claim 1, wherein said source, well, and drain regions are respectively disposed substantially symmetrically about a plane transverse to said main surface and parallel and passing through a center axis of the said groove.

8. A power MOS FET as claimed in claim 1, wherein said source region meets said gate insulating layer at a vertex formed by the junction of said main surface and said groove, and wherein said well region brackets said source region about said vertex.

9. A power MOS FET comprising:
   a semiconductor substrate having a substantially planar upper surface;
   a drain region exposed along portions of said upper surface;
   a channel forming region formed in said drain region and having an area exposed along portions of said upper surface;
   a source region formed in said channel forming region and exposed along said upper surface;
   a groove having inclined surfaces extending downwardly through said upper surface, said source region, said channel forming region, and said drain region, wherein said source region, said channel forming region, and said drain region are exposed along the inclined surfaces of said groove;
   a gate insulating area disposed above said groove and said upper surface;
   a gate electrode layer disposed above said gate insulating area, said gate electrode layer covering said area of said channel forming region exposed along portions of said upper surface.

10. A power MOS FET according to claim 9, wherein said groove is of a V-shaped configuration.

11. A power MOS FET according to claim 9, wherein said groove is of a substantially circular, concave configuration.

12. A power MOS FET according to claim 9, wherein said gate insulating layer comprises a silicon oxide layer.

13. A power MOS FET according to claim 10, wherein said gate insulating layer comprises a silicon oxide layer.

14. A power MOS FET according to claim 11, wherein said gate insulating layer comprises a silicon oxide layer.

15. A power MOS FET according to claim 9, wherein said source, channel forming, and drain regions are respectively disposed substantially symmetrically about a plane transverse to said upper surface and parallel and passing through a center axis of said groove.

16. A power MOS FET according to claim 9, wherein said source region meets said gate insulating layer at a vertex formed by the junction of said upper surface and said groove, and wherein said channel forming region brackets said source region about said vertex.

* * * * *